(12) United States Patent
Walker

(10) Patent No.: US 7,638,836 B2
(45) Date of Patent: Dec. 29, 2009

(54) NONVOLATILE MEMORY WITH BACKPLATE

(75) Inventor: Andrew J. Walker, Mountain View, CA (US)

(73) Assignee: Schiltron Corporation, Mountain View, CA (US)

( * ) Notice: Subject to any disclaimer, the term of this patent is extended or adjusted under 35 U.S.C. 154(b) by 0 days.

(21) Appl. No.: 11/749,060

(22) Filed: May 15, 2007

(65) Prior Publication Data
US 2008/0285349 A1 Nov. 20, 2008

(51) Int. Cl.
*H01L 21/336* (2006.01)
(52) U.S. Cl. ....................... 257/324; 257/390
(58) Field of Classification Search ........... 257/390, 257/681, E27.102, E27.103, E21.662, E21.666, 257/E21.663, E21.664, E21.667, E21.671, 257/E21.677, E21.68, 314–326, E21.179–E21.182, 257/E21.209–E21.21, E21.422, E21.423, 257/E21.679–E21.694; 438/257; 365/185.17
See application file for complete search history.

(56) References Cited
U.S. PATENT DOCUMENTS 6,054,734 A * 4/2000 Aozasa et al. ............... 257/315
6,901,006 B1 * 5/2005 Kobayashi et al. ...... 365/185.01
7,180,135 B1 * 2/2007 Ioannou et al. ............. 257/347
7,339,821 B2 * 3/2008 Walker ................... 365/185.02
7,410,845 B2 * 8/2008 Walker ....................... 438/157
2004/0069990 A1 * 4/2004 Mahajani et al. ............... 257/66
2004/0125629 A1 * 7/2004 Scheuerlein et al. .......... 365/17
2005/0079675 A1 * 4/2005 Ilkbahar et al. ............. 438/261
2005/0128807 A1 * 6/2005 Chen et al. ............. 365/185.17
2006/0138519 A1 * 6/2006 Kang et al. .................. 257/314
2007/0029618 A1 * 2/2007 Walker ....................... 257/368
2007/0126033 A1 * 6/2007 Walker et al. ............... 257/250

\* cited by examiner

*Primary Examiner*—Dao H Nguyen
*Assistant Examiner*—Tram H Nguyen
(74) *Attorney, Agent, or Firm*—Haynes and Boone, LLP

(57) ABSTRACT

The present invention provides a non-volatile memory string having serially connected dual-gate devices, in which a first gate dielectric layer adjacent a first gate electrode layer in each dual-gate device is charge-storing and in which the second gate electrode adjacent a non-charge storing gate dielectric layer are connected in common. In one implementation, the second gate electrodes of the dual-gate devices in the memory string are provided by a continuous layer of doped polysilicon, tungsten, tantalum nitride, tungsten nitride or any combination of two or more of these conductors.

13 Claims, 1 Drawing Sheet

NONVOLATILE MEMORY WITH BACKPLATE

BACKGROUND OF THE INVENTION

1. Field of the Invention

The present invention relates to semiconductor devices. In particular, the present invention relates to serially-connected dual-gate devices used in non-volatile memory strings.

2. Discussion of the Related Art

A NAND-type memory string consists of a number of serially connected storage transistors. During programming of a NAND-type memory string, the source terminal of the storage transistor to be programmed is connected to a predetermined low voltage at one end of the memory string through inversion channels of all the intermediate storage transistors situated in between that end of the memory string and the storage transistor to be programmed. To provide that connection, the inversion channel of each of the intermediate storage transistors is made conducting by applying a "program pass voltage" at the gate electrode of the intermediate storage transistor. A programming voltage is then applied to the storage transistor to be programmed. Typically, the programming voltage is much higher than the program pass voltage.

A common problem with such a NAND-type flash memory string is "program disturb," which occurs during programming of a memory cell in a NAND-type memory string. By applying a program pass voltage at the gate electrode, electrons in the inversion layer associated with an intermediate storage transistor may inadvertently be introduced into the charge storage gate dielectric layer of the intermediate storage transistor, thereby disturbing the programmed state of the intermediate storage transistor.

SUMMARY

The present invention provides a non-volatile memory string having serially connected dual-gate devices, in which a first gate dielectric layer adjacent a first gate electrode layer in each dual-gate device is charge-storing and in which the second gate electrode adjacent a non-charge storing gate dielectric layer are connected in common.

In one implementation, the second gate electrodes of the dual-gate devices in the memory string are provided by a continuous layer of doped polysilicon, tungsten, tantalum nitride, tungsten nitride or any combination of two or more of these conductors.

The present invention is better understood upon consideration of the detailed description below in conjunction with the accompanying drawing.

DETAILED DESCRIPTION OF THE PREFERRED EMBODIMENTS

Figure 1:
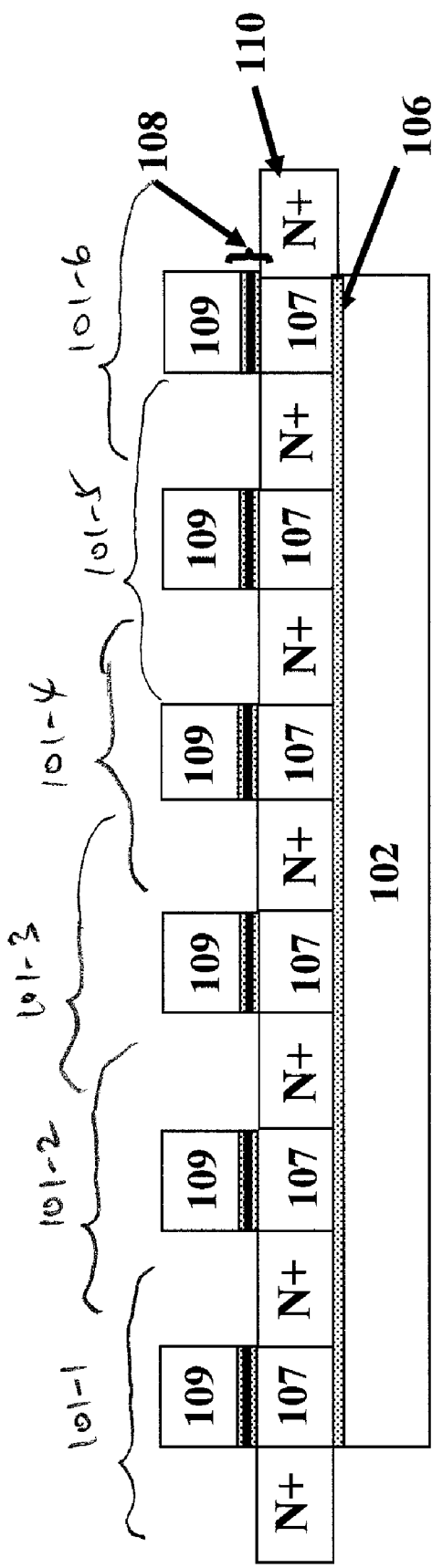
FIG. 1 shows NAND-type non-volatile memory string 100, including serially connected dual-gate devices 101-1 to 101-6, in accordance with one embodiment of the present invention.

The present invention provides a NAND-type non-volatile memory string using dual-gate devices that share a common back gate. Dual-gate devices have been used in non-volatile memory strings (e.g., NAND-type flash memory strings). Such non-volatile memory strings are described, for example, in copending U.S. patent application ("Copending Application"), entitled "DUAL-GATE DEVICE AND METHOD," Ser. No. 11/197,462, filed on Aug. 3, 2005, describes various configurations of dual-gate devices that can be used to form NAND memory strings to achieve very high storage densities. The disclosure of the Copending Application is hereby incorporated by reference in its entirety to provide background information regarding dual-gate memory devices.

FIG. 1 shows NAND-type non-volatile memory string 100, including serially connected dual-gate devices 101-1 to 101-6, in accordance with one embodiment of the present invention. As shown in FIG. 1, each dual-gate device (e.g., dual-gate device 101-1) includes first gate electrode 109 (also referred to as "front gate electrode"), storage gate dielectric layer 108, $N^+$ source-drain diffusion regions 110, lightly doped channel region 107, second gate dielectric layer 106 and common gate electrode 102. Second gate dielectric layer 106 and common gate electrode 102 are shared among dual-gate devices 101-1 to 101-6. In this embodiment, second gate dielectric layer 106 is not charge-storing.

Common gate electrode 102, also referred to as the "backplate", allows inversion to take place within channel region 107 adjacent second gate dielectric layer 106 and coincident with backplate gate electrode 102. Under this configuration, any of dual-gate devices 101-1 to 101-6 may be programmed by applying a programming voltage to the corresponding front gate electrode 109, with the connection to the low voltage reference provided by inversion layers in the lightly doped channel regions 107 induced by the backplate. Accordingly, no program pass voltage is applied to the front gate electrode in any of the intermediate storage transistors, thereby avoiding possible program disturb.

According to one embodiment of the present invention, common electrode 102 may be implemented by a suitable conductor, such as doped polysilicon, tungsten, tantalum nitride, tungsten nitride or any combination of two or more of these conductors. Second gate dielectric layer 106 may be implemented by an insulator oxide, e.g., silicon dioxide, or a high dielectric constant ("High-K") material. Lightly doped channel region 107 may be provided by amorphous silicon, germanium, a combination of amorphous silicon and germanium, polycrystalline silicon, or a combination of polycrystalline silicon and germanium. The dopant concentration may be either p-type or n-type, at a concentration between $10^{14}$ $cm^{-3}$ to $10^{19}$ $cm^{-3}$. Source-drain diffusion regions 110 may be provided by heavily-doped amorphous silicon, germanium, a combination of heavily-doped amorphous silicon and germanium, polycrystalline silicon, or a combination of polycrystalline silicon and germanium. The dopant concentration may be either p-type or n-type, at a concentration between $10^{19}$ $cm^{-3}$ to $10^{21}$ $cm^{-3}$.

First charge storage gate dielectric layer 108 may include stacked layers of materials, such as a silicon dioxide-silicon nitride-silicon dioxide stack. Alternatively, the silicon nitride in the stack may be provided instead by a silicon oxynitride layer or a graded layer of silicon nitride with spatial variations in oxygen content. In another alternative implementation, instead of silicon nitride, nanocrystals of silicon, germanium or a metal (e.g., tungsten) may be provided. Other possible materials for first charge storage gate dielectric layer 108 include aluminum oxide or another High-K material. In one embodiment, first charge storage gate dielectric layer 106 may include, in order from first gate electrode 109 to lightly doped channel region 107, a 50-200 Å thick layer of aluminum oxide, a 50-150 Å thick silicon nitride, and a 15-60 Å thick silicon dioxide.

First gate electrode 109 may be provided by a suitable conductor (e.g., doped polysilicon, tungsten, tantalum nitride, tungsten nitride or any combination of two or more these materials).

The above detailed description is provided to illustrate specific embodiments of the present invention and is not intended to be limiting. Numerous variations and modifications within the scope of the present invention are possible. The present invention is set forth in the following claims.

I claim:

1. A NAND-type non-volatile memory string, comprising a plurality of serially connected dual-gate devices, each dual-gate device having a first gate dielectric layer provided between a first gate electrode and a lightly doped channel region and a second gate dielectric layer provided between the lightly doped channel region and a second gate electrode, wherein the first gate dielectric layer is charge-storing and wherein the second gate electrodes of the dual-gate devices are connected in common.

2. A NAND-type non-volatile memory string as in claim 1, wherein the first gate dielectric layer comprises stacked layers of materials.

3. A NAND-type non-volatile memory string as in claim 2, wherein the materials comprise a selected charge-storing material between silicon oxide layers.

4. A NAND-type non-volatile memory string as in claim 3, wherein the charge-storing material comprises one or more of: silicon nitride, silicon oxynitride, a graded layer of silicon nitride with spatial variations in oxygen content, nanocrystals of silicon, germanium tungsten or another metal, aluminum oxide, or a High-K material.

5. A NAND-type non-volatile memory string as in claim 1, wherein the first gate electrode comprises doped polysilicon, tungsten, tantalum nitride, tungsten nitride or any combination of two or more these conductors.

6. A NAND-type non-volatile memory string as in claim 1, wherein the second gate electrodes of the dual-gate devices in the memory string are provided by a continuous layer of doped polysilicon, tungsten, tantalum nitride, tungsten nitride or any combination of two or more of these conductors.

7. A method in a NAND-type non-volatile memory string, comprising:
    Serially connecting a plurality of dual-gate devices, wherein each dual-gate device having a first gate dielectric layer provided between a first gate electrode and a lightly doped channel region and a second gate dielectric layer provided between the lightly doped channel region and a second gate electrode and wherein the first gate dielectric layer is charge-storing; and
    providing the second gate electrodes as a continuous layer conducting material.

8. A method as in claim 7, further comprising providing the first gate dielectric layer as stacked layers of materials.

9. A method as in claim 8 wherein the materials comprise a selected charge-storing material between silicon oxide layers.

10. A method as in claim 9 wherein the charge-storing material comprises one or more of: silicon nitride, silicon oxynitride, a graded layer of silicon nitride with spatial variations in oxygen content, nanocrystals of silicon, germanium, tungsten or another metal, aluminum oxide, or a High-K material.

11. A method as in claim 7, wherein the first gate electrode comprises doped polysilicon, tungsten, tantalum nitride, tungsten nitride or any combination of two or more these conductors.

12. A method as in claim 1, wherein said first gate electrode and said second gate electrode comprise one of: doped polysilicon, tungsten, tantalum nitride, tungsten nitride or any combination of two or more of these conductors.

13. A method in a NAND-type non-volatile memory string, comprising:
    Serially connecting a plurality of dual-gate devices, wherein each dual-gate device having a first gate dielectric layer provided between a first gate electrode and a lightly doped channel region and a second gate dielectric layer provided between the lightly doped channel region and a second gate electrode and wherein the first gate dielectric layer is charge-storing; and
    connecting the second gate electrodes of the dual-gate devices in common.

* * * * *